(12) United States Patent
Koller et al.

(10) Patent No.: US 10,091,866 B2
(45) Date of Patent: Oct. 2, 2018

(54) DEVICE WITH SWITCHABLE HEAT PATH

(71) Applicant: Intel IP Corporation, Santa Clara, CA (US)

(72) Inventors: Sonja Koller, Regensburg (DE); Georg Seidemann, Landshut (DE); Vishnu Prasad, Putzbrunn (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/386,905

(22) Filed: Dec. 21, 2016

(65) Prior Publication Data
US 2018/0177037 A1 Jun. 21, 2018

(51) Int. Cl.
| H05K 1/00 | (2006.01) |
| H05K 1/02 | (2006.01) |
| H05K 1/18 | (2006.01) |
| H05K 5/02 | (2006.01) |
| H05K 7/20 | (2006.01) |
| H05K 9/00 | (2006.01) |
| G06F 1/20 | (2006.01) |

(52) U.S. Cl.
CPC .......... *H05K 1/0203* (2013.01); *G06F 1/206* (2013.01); *H05K 1/181* (2013.01); *H05K 5/0217* (2013.01); *H05K 7/20218* (2013.01); *H05K 9/0024* (2013.01); *H05K 2201/062* (2013.01); *H05K 2201/10151* (2013.01)

(58) Field of Classification Search
None
See application file for complete search history.

(56) References Cited

U.S. PATENT DOCUMENTS

2010/0309631 A1* 12/2010 Hill .................... G06F 1/203
361/705
2014/0190185 A1* 7/2014 Bell ..................... F25B 21/04
62/3.3
(Continued)

FOREIGN PATENT DOCUMENTS

| JP | 2009193350 A | 8/2009 | |
| JP | 2012074529 A | 4/2012 | |
| TW | 201411319 | * 3/2014 | ............... H05K 7/20 |

OTHER PUBLICATIONS

"ROG GX700VO", ASUS-GX700—World's First Liquid-Cooled Gaming Laptop, [Online]. Retrieved from the Internet: URL: https://www.asus.com/us/Notebooks/ROG-GX700VO/, (Accessed Dec. 7, 2016), 14 pgs.
(Continued)

*Primary Examiner* — Dimary Lopez Cruz
*Assistant Examiner* — Zhengfu Feng
(74) *Attorney, Agent, or Firm* — Schwegman Lundberg & Woessner, P.A.

(57) ABSTRACT

Discussed generally herein are devices that include a switchable heat path. A device can include a device skin, a circuit board, a plurality of components on the circuit board, and a switchable heat path situated between the components and the device skin, the switchable heat path configured to be switched between an on state and an off state, the switchable heat path configured to conduct a first amount of heat from the components to the device skin when in the on state and configured to conduct a second, lesser amount of heat from the components to the device skin when in an off state.

20 Claims, 6 Drawing Sheets

(56) References Cited

U.S. PATENT DOCUMENTS

2014/0362518 A1* 12/2014 Huang ................... G06F 1/206
                                                  361/679.46
2015/0124408 A1  5/2015 Barnes et al.
2016/0330864 A1  11/2016 Huang et al.
2016/0338232 A1  11/2016 Liu et al.

OTHER PUBLICATIONS

"International Appiication Serial No. PCT/US2017/062809, International Search Report dated Feb. 8, 2018", 3 pgs.
"International Application Serial No. PCT/US2017/062809, Written Opinion dated Feb. 8, 2018", 8 pgs.

* cited by examiner

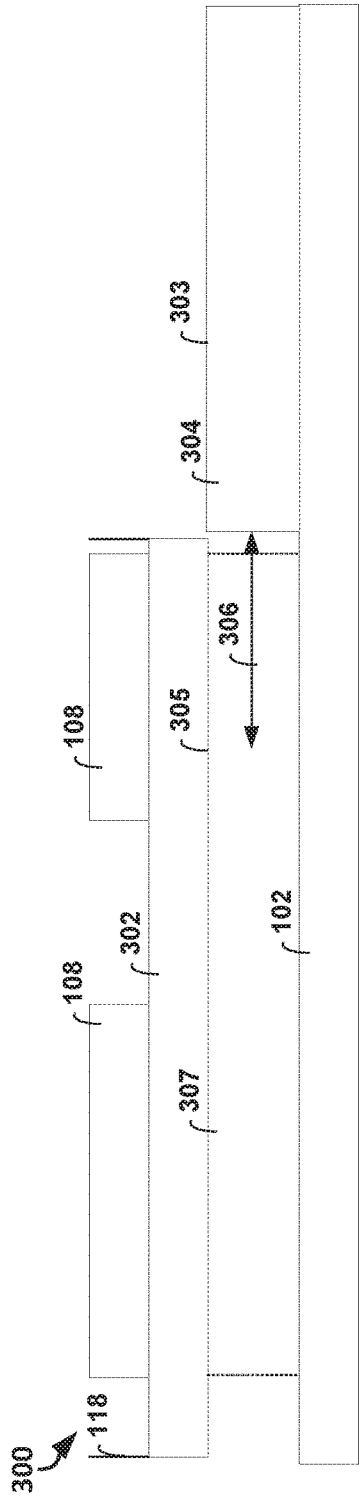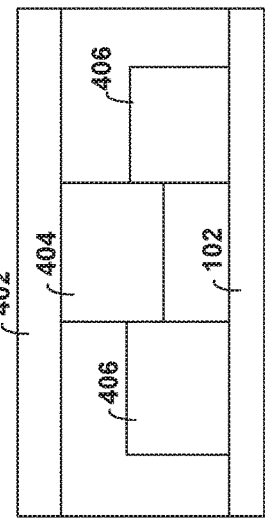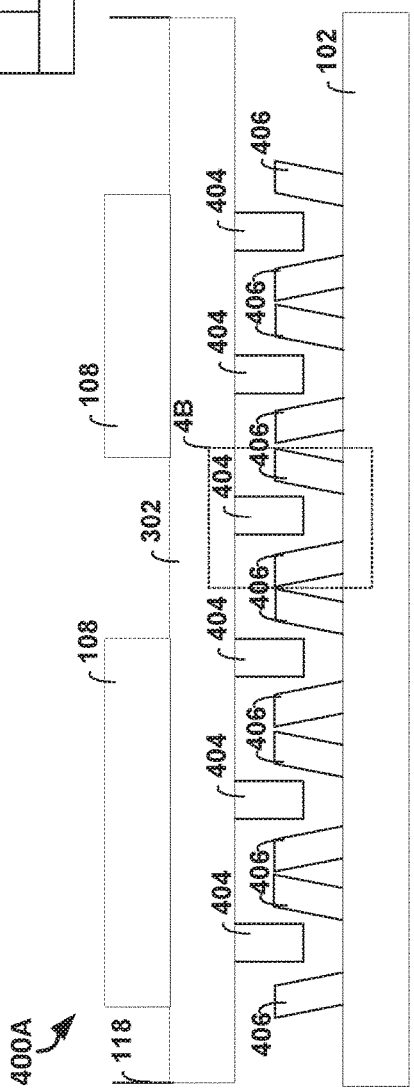

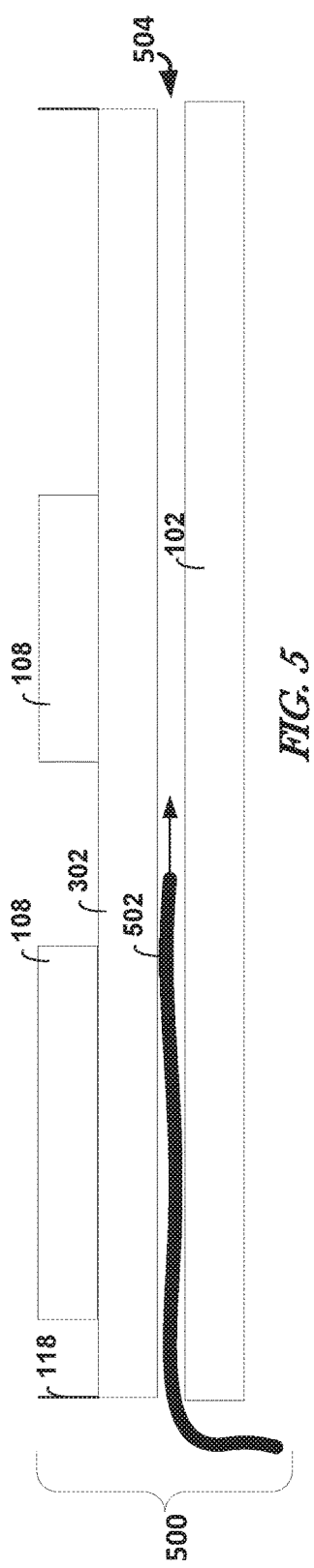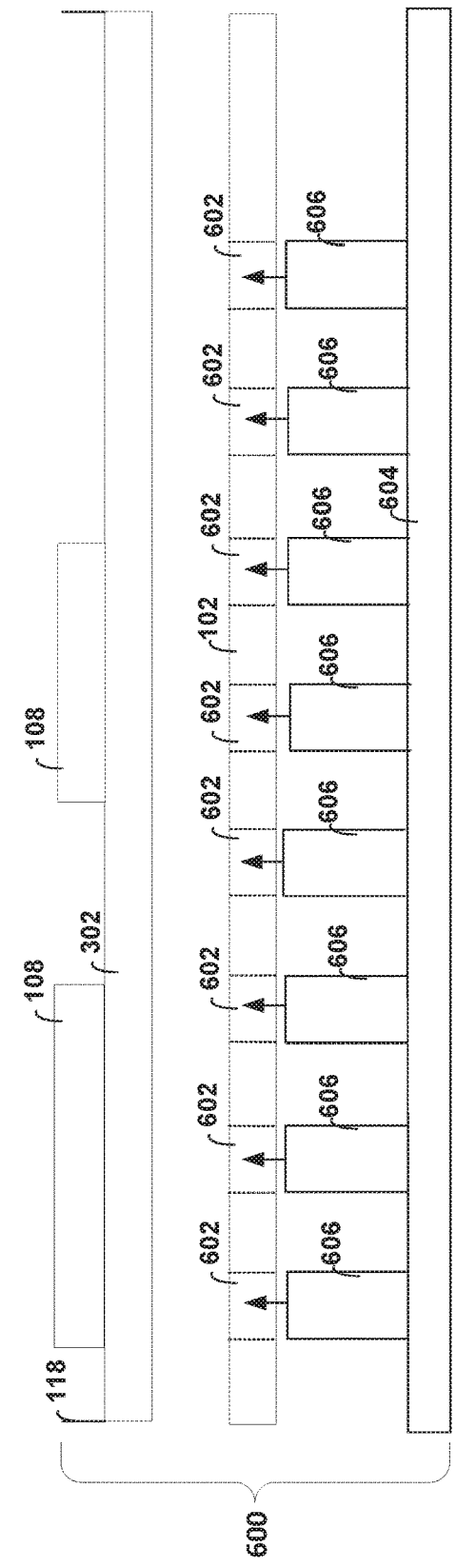

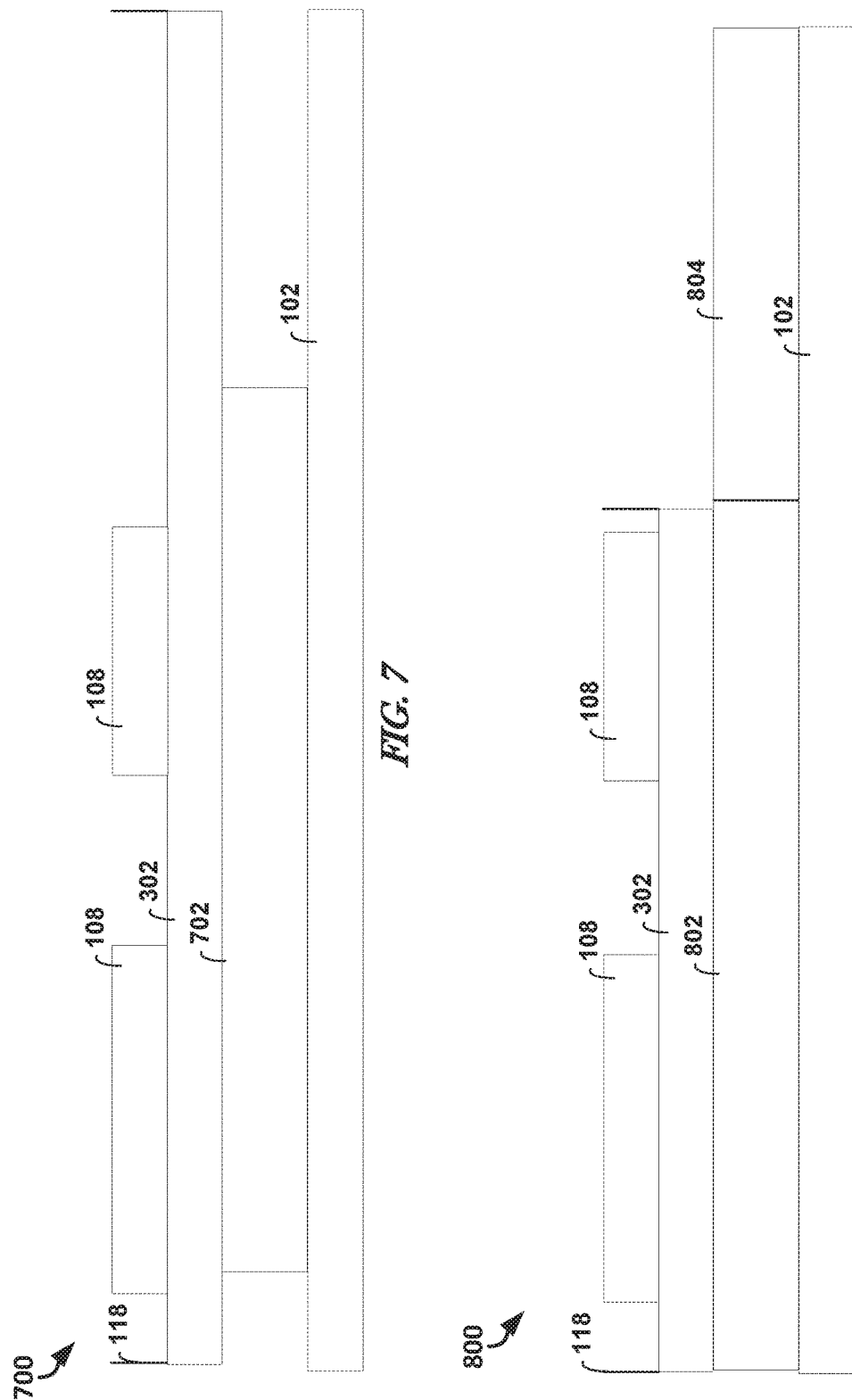

DEVICE WITH SWITCHABLE HEAT PATH

TECHNICAL FIELD

This disclosure relates generally to devices that include heat dissipation.

BACKGROUND ART

Devices, such as electronic devices, create heat. The heat can be detrimental to electrical and/or mechanical performance of electronic or mechanical components of the device. In a user device, the heat can cause an uncomfortable user experience.

BRIEF DESCRIPTION OF THE DRAWINGS

FIG. 3 illustrates, by way of example, an exploded-view diagram of an embodiment of a system for dissipating heat from a device in the region corresponding to the dashed box labelled "3, 4A, 5, 6, 7, 8" in FIG. 1.

FIG. 4A illustrates, by way of example, an exploded-view diagram of another embodiment of a system for dissipating heat from a device in the region corresponding to the dashed box labelled "3, 4A, 5, 6, 7, 8" in FIG. 1.

FIG. 4B illustrates, by way of example, an exploded-view diagram of an embodiment of a region of the system of FIG. 4A corresponding to the dashed box labelled "4B".

FIG. 5 illustrates, by way of example, an exploded-view diagram of yet another embodiment of a system for dissipating heat from a device in the region corresponding to the dashed box labelled "3, 4A, 5, 6, 7, 8" in FIG. 1.

FIG. 6 illustrates, by way of example, an exploded-view diagram of yet another embodiment of a system for dissipating heat from a device in the region corresponding to the dashed box labelled "3, 4A, 5, 6, 7, 8" in FIG. 1.

FIG. 7 illustrates, by way of example, an exploded-view diagram of yet another embodiment of a system for dissipating heat from a device in the region corresponding to the dashed box labelled "3, 4A, 5, 6, 7, 8" in FIG. 1.

FIG. 8 illustrates, by way of example, an exploded-view diagram of yet another embodiment of a system for dissipating heat from a device in the region corresponding to the dashed box labelled "3, 4A, 5, 6, 7, 8" in FIG. 1.

DESCRIPTION OF THE EMBODIMENTS

Figure 1:
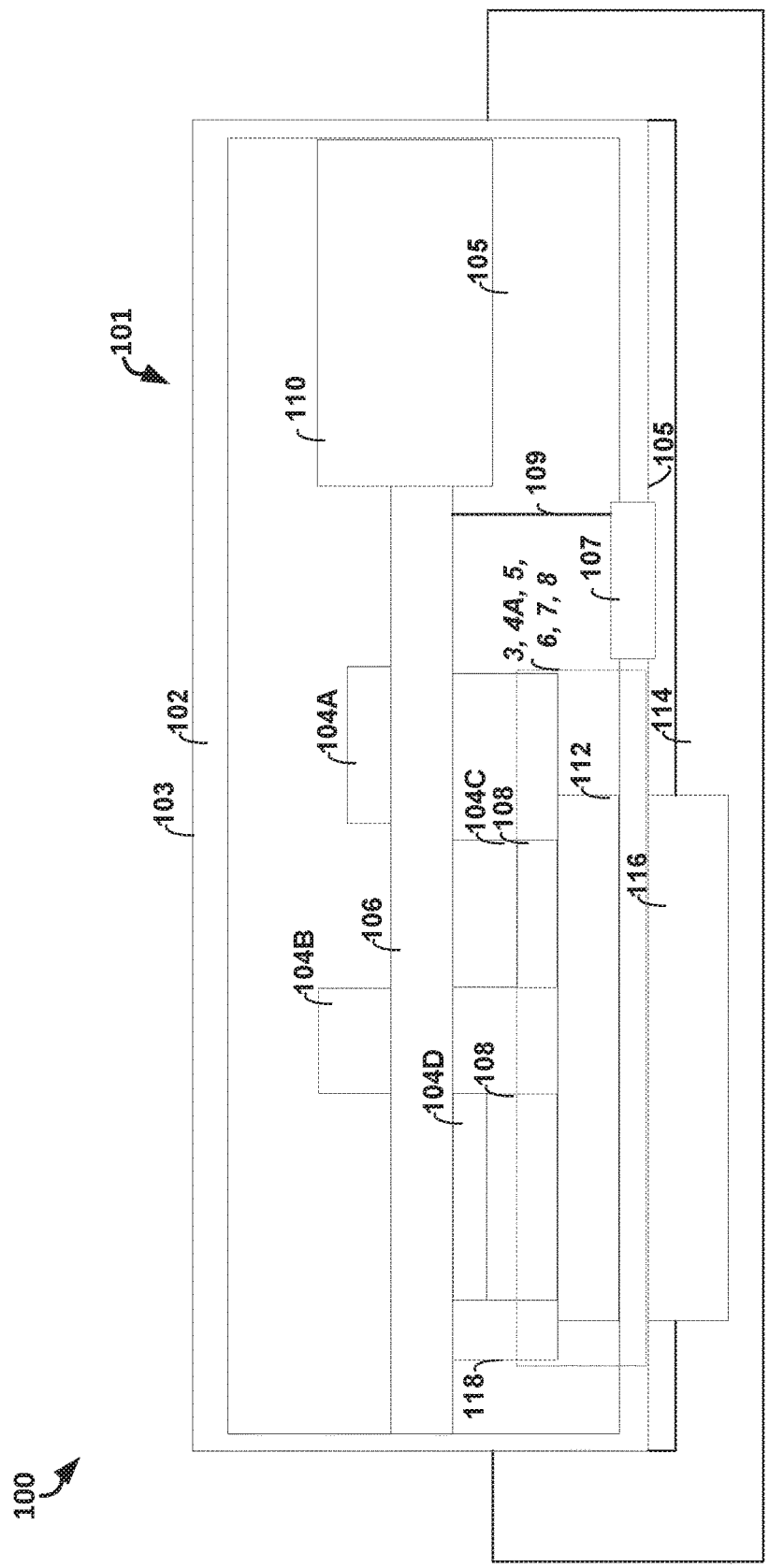
FIG. 1 illustrates, by way of example, a cross-section view diagram of an embodiment of a system that includes heat dissipation.

The following description and the drawings sufficiently illustrate specific embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

In handheld or wearable computing devices (e.g., phones, tablets, smart watches, or the like), the allowed device skin temperature is limited, at least in part, because of ergo limits. A device that exceeds an ergo limit can cause discomfort, pain, and/or damage to a user. A permanent heat path which directly takes heat from an inside heat source to the device skin can raise a user's skin temperature above an ergo limit.

One or more embodiments can include a switchable heat path that transmits heat external to the device, such as by transmitting the heat to a skin of the device, which dissipates the heat to an environment external to the device. The skin of the device is an element of the device with a face that is external to the device. In one or more embodiments in which the device is in contact with (or otherwise near a user's skin), such as by being grasped in a user's hand, the switchable heat path can be off. If the device is not in contact with the user's skin, a switchable heat path can enhance the cooling of the device, such as when the switchable heat path is switched "on". In one or more embodiments, a switchable heat path might not directly contact the device skin, but contact an internal heat spreader, and deactivation of the path might be necessary when other components (to which heat is transported via the heat spreader) get overheated.

In one or more embodiments, a direct heat path, such as to the device skin, can be switched on, such as to enhance cooling, such as when a user's skin is not in contact with the device. Heat (additional heat) can thus be extracted from the device by external cooling. While external cooling is active (the switchable heat path is turned "on"), the device skin can have an increased heat. The heat path to the device skin can be switched off to deactivate enhanced cooling, such as to keep the device skin temperature within ergo limits.

A previous solution to managing heat of a device can include using a thermal interface material (TIM) between one or more electrical or electronic components and a shielding can of the device or other air gaps in the device. The TIM can help increase an amount of heat transferred between the one or more components and the can. The increased amount of transferred heat can help distribute the heat to the can away from the components.

One or more embodiments includes a switchable path between the TIM (e.g., and the shielding can) and a device skin. The TIM can be on a first side of the shielding can and the switchable heat path can be on a second, opposite side of the shielding can.

Electric and/or electronic component (e.g., integrated circuit (IC), resistor, transistor, capacitor, diode, inductor, regulator (voltage and/or current), antenna, radio (e.g., transmit, receive, and/or transceiver), modulator, demodulator, amplifier, switch (e.g., multiplexer or the like), oscillator, sensor, or the like) and skin temperatures have been simulated. The simulations include the phone in multiple environments, such as outside of a holder, in a holder without a heat sink, and in a holder with a heat sink. FIG. 1 illustrates an example of a device in a holder with a heat sink. Assumptions of the simulation included an IC load of two (2) Watts and 25° C. ambient temperature. For each of the environments, three heat dissipation solutions were simulated including a device without any TIMs or a switchable heat path activated, a device with TIMs between the can and the components and without a switchable heat path activated, and a device with TIMs and a switchable heat path activated. An example of such a simulation of a device showed that the switchable heat path reduces temperature of electronics of the device. Table 1 summarizes results of such a simulation.

TABLE 1

EXAMPLE SIMULATION RESULTS

| | Outside Of Holder (A) | In Holder Without Heat Sink (B) | In Holder With Heat Sink (C) |
|---|---|---|---|
| Without TIM (I) | IC: 86° C. Backskin: 38° C. | IC: 88° C. Backskin: 41° C. | IC: 87° C. Backskin: 39° C. |
| With TIM Beneath Shielding (II) | IC: 79° C. Backskin: 38° C. | IC: 81° C. Backskin: 42° C. | IC: 80° C. Backskin: 39° C. |
| With TIM and Switchable Heat Path Activated (III) | IC: 51° C. Backskin: 43° C. | IC: 55° C. Backskin: 47° C. | IC: 51° C. Backskin: 42° C. |

As can be seen from Table 1, solutions (I) and (II) yield, in all environment conditions (A)-(C) IC temperatures between 80 to 90° C. and device skin temperatures between 38-42° C. Solutions with a TIM provide about a 7° C. temperature reduction as compared to solutions without a TIM. With the solution (III) the IC temperature is simulated as being reduced by 26° C. or more as compared to both solutions (I) and (II) at the expense of increasing the device skin temperature a few degrees as compared to the solutions (I) and (II).

The temperature of the device skin, in some circumstances, can exceed a limit at which a user is comfortable contacting the device skin. To help ensure that the temperature of the skin remains below a temperature at which a user is comfortable touching the device skin, the temperature of the skin and/or whether the user is contacting the device can be monitored, such as by one or more sensors and/or processing circuitry. For example, consider (III)(B) from Table 1. In response to detecting the skin temperature is greater than 42° C., processing circuitry can cause the switchable heat path to be deactivated.

The switchable heat path in the device can be activated by dynamically closing thermal gaps (e.g., air gaps) between the shield can and the device skin. This can be done by, for example, re-locating heat conducting parts (like TIMs) inside the device; inserting heat conducting external parts into the device which close the gaps or can in addition even drain the heat from the device; dynamically change thermal conductivity of material which fill the thermal gaps inside the device, such as by causing the material to go through a phase change; and/or dynamically insert/change/drain fluids in the thermal gaps inside the device.

Skin contact of the user with the device can be detected by a processing circuitry based on data received from one or more sensors, such as can include a heartbeat sensor; temperature sensor, moisture sensor; conductivity sensor, and/or motion sensor. In one or more embodiments, the switchable heat path can be mechanically or electrically activated, such as by a user or the processing circuitry.

Whether sufficient heat dissipation to the device skin is present can be detected using a temperature sensor that monitors the temperature of the device skin and/or a temperature sensor that monitors a temperature of the electric and/or electronic components. Whether sufficient external cooling of the device skin is present can be detected using a temperature sensor that monitors the temperature of the device skin. Some examples of external cooling environments include a cool or cold environment, a passive or active heat sink (e.g., integrated in device holder as in FIG. 1), a fan, a heat pipe, or the like. In one or more embodiments, dedicated cooling solutions can be implemented in device stands or holders to allow higher performance usage, such as through enhanced cooling.

Reference will now be made to the FIGS. to describe further details of embodiments.

FIG. 1 illustrates, by way of example, a cross-section view diagram of an embodiment of a system 100 that includes a switchable heat path. The system 100 as illustrated includes a device 101 situated in a device holder 114. The device 101 as illustrated includes a device skin 102 with a front side 103 and a back side 105. The front side 103 is generally the side through which a user interacts with the device 101. The user can provide input through a touch screen, keypad, microphone, or the like, such as by interacting with the front side 103. The back side 105 is generally the part of the device 101 that rests in a hand of a user.

The device skin 102 is the housing for electronics and other components that provide the functionality of the device 101 to the user. The device skin 102 is illustrated as housing electric or electronic components 104A, 104B, 104C, and 104D electrically connected to a circuit board 106, such as a printed circuit board (PCB) or a flexible circuit board. A battery 110 is electrically connected to one or more electrical connections of the circuit board 106, such as to provide electrical power to the components 104A-D. The components 104A-D can include an IC, resistor, transistor, capacitor, diode, inductor, regulator (voltage and/or current), antenna, radio (e.g., transmit radio, receive radio, and/or transceiver), modulator, demodulator, amplifier, switch (e.g., multiplexer or the like), oscillator, and/or sensor, such as a sensor previously discussed herein.

A sensor 107 can be situated on or at least partially in the device skin 102, such as to gather data that can be interpreted to determine whether a user has the device 101 in their hand. The sensor 107 can be electrically connected to the circuit board 106, such as through an electrical connection 109. The sensor 107 can include a heartbeat sensor, temperature sensor, moisture sensor, conductivity sensor, and/or motion sensor.

The components 104C-D can be shielded from electromagnetic radiation by a shield can 118. The shield can 118, in one or more embodiments, can act as a Faraday cage for the components 104C-D. The shield can 118 can be made of a metal or other material that interacts with the electromagnetic radiation and couples it to a ground.

The TIM 108 is arranged between components of the device 101, such as to conduct heat away from the components 104C-D. In the embodiment illustrated in FIG. 1, the TIM 108 is arranged between the components 104C-D and the can 118. The TIM 108 conducts heat away from the components 104C-D to the can 118. The can 118 transfer heat (e.g., by conduction and/or convection) to the environment around the can, such as an air gap 105 between the can 118 and the skin 102, or the switchable heat path 112. The TIM 108, in one or more embodiments, can include a thermal grease, thermal glue, a thermal gap filler, a thermal pad, and/or thermal adhesive.

The switchable heat path 112 can be turned "on" and "off". In the embodiment of FIG. 1 the switchable heat path is illustrated as being in the on state. On means that the switchable heat path 112 is in a location or state that allows it to conduct heat from the components 104A-D, the shielding can 118, the battery 110, or other component of the device 101, to the device skin 102. The switchable heat path 112, in one or more embodiments, can be in contact with the shield can 118 and the device skin 102, simultaneously, in the on position. In one or more embodiments, the switchable heat path 112 can be in contact the device skin 102 and not in contact with the can 118 in an off position. In one or more embodiments, such as in embodiments in which the switchable heat path includes a phase change material (described further elsewhere herein), the switchable heat path 112 can be in contact with the can 118 and the skin 102, simultaneously, in the off position. In one or more embodiments, the switchable heat path 112 can be in thermal contact with the device skin 102 and not in contact with the can 118.

The switchable heat path 112 in one or more embodiments, can be re-located within the device 101, such as to switch the switchable heat path 112 between the on state and the off state. The re-location moves the heat conducting materials of the switchable heat path thereby closing one or more thermal gaps between components of the device 101. Such re-location can be electrically and/or mechanically activated. In one or more embodiments, the relocation can be strictly internal to the device 101, such that the switchable heat path 112 remains internal to the device 101. In one or more other embodiments, the switchable heat path 112 can be removed from the device 101 and/or inserted into the device 101, such that the switchable heat path 112 can be removed from the device 101. In one or more embodiments, heat conducting elements from the device holder 114 can be inserted into the device 101, such as to be in contact with the can 118 and/or the thermal interface material 108, such as to turn the switchable heat path 112 to an on state. The conductive heating elements inserted into the device 101 can not only help close a thermal gap, but can additionally include components, such as heat pipes, that contribute to cooling. Embodiments of re-locatable switchable heat paths are provided in FIGS. 3, 4A, 4B, 5, and 6. Embodiments of heat conducting elements that are inserted to the device 101 from the external environment are provided in FIGS. 5 and 6. Embodiments of heat conducting elements that are strictly internal to the device 101 are provided in FIGS. 3, 4A, and 4B.

In one or more embodiments, the switchable heat path 112 can include a phase change material that changes from a lower heat conducting state in an off state to a higher heat conducting state in an on state. The phase change can be from a liquid to a solid. The phase change can be initiated by providing an electrical stimulus to the phase change material, activating a component of the components 104A-D (e.g., a fan, a liquid or gas pipe that can be agitated, such as by a pump, to transfer heat away from the components, or similar component) that circulates heat within the device skin 102 to the phase change material, such as to increase or decrease the heat incident on the phase change material. The phase change material can be chosen so as to change the phase of material at a specified temperature, such as a temperature below or above a specified threshold (e.g., the ergo limit). An embodiment of such a switchable heat path is provided in FIG. 7.

In one or more embodiments, a heat conducting material (e.g., a fluid) can be pumped into a reservoir to switch the switchable heat path 112 to the on state and the material can be pumped out of the reservoir to switch the switchable heat path 112 to the off state. The fluid can include one or more of water, deionized water, glycol (e.g., ethylene glycol and/or propylene glycol, such as mixed with water), and a dielectric fluid (e.g., polyalphaolefin (PAO), a perfluorinated carbon). The reservoir of the switchable heat path 112 can include one or more surfaces in contact with the device skin 102 and one or more (other or same) surfaces in contact with the TIM 108 and/or the shield 118.

The device holder 114 can include an integrated heat conducting device 116, such as to aid in cooling of the device 101 through heat conducted through the device skin 102. The heat conducting device 116 can include a heat sink, other heat conducting structure discussed herein, or the like.

Figure 2:
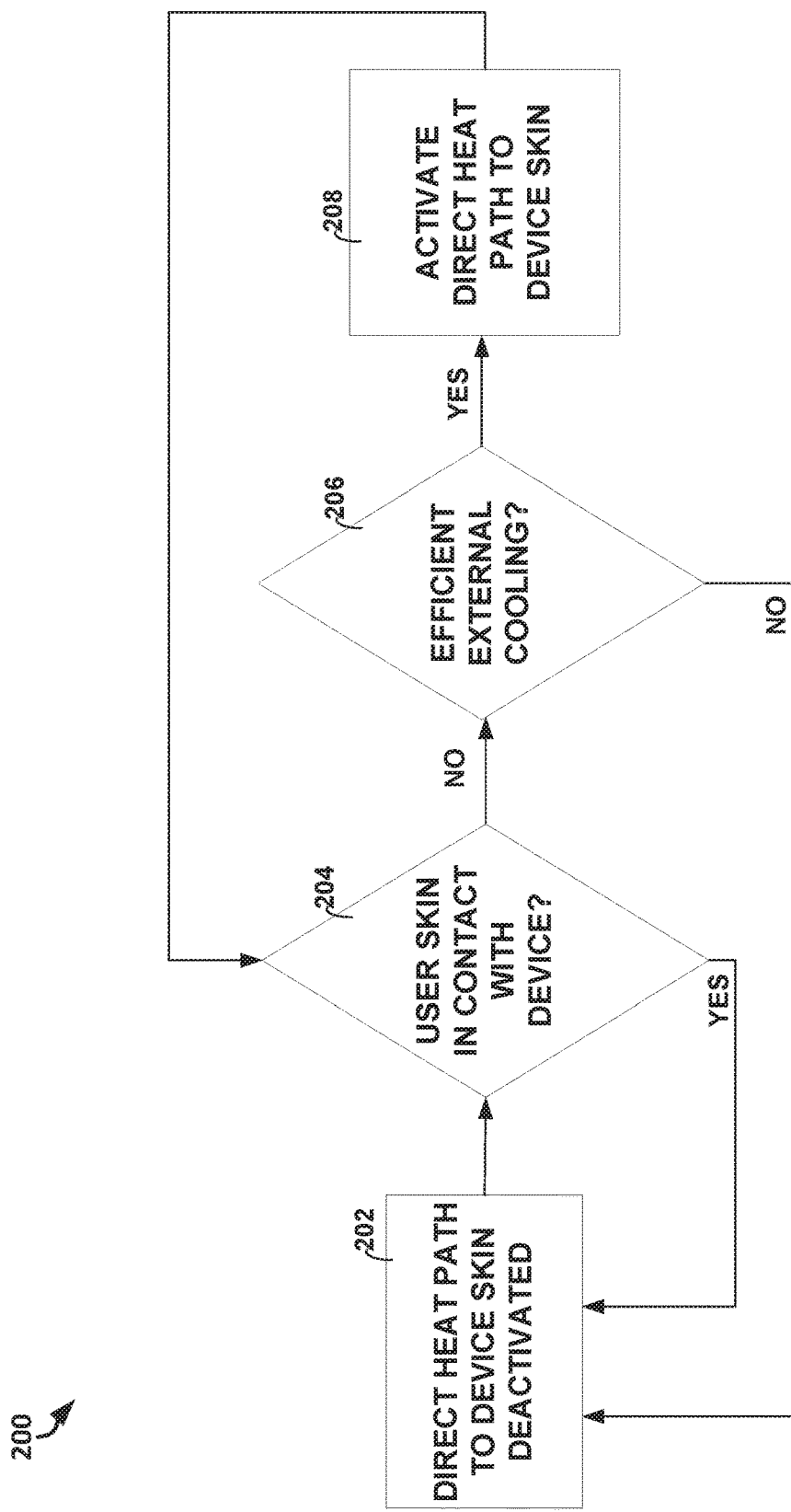
FIG. 2 illustrates, by way of example, a flow diagram of an embodiment of a method for dissipating heat from a device.

FIG. 2 illustrates, by way of example, a flow diagram of an embodiment of a method 200 for dissipating heat from a device. The method 200 as illustrated includes (at some point in time) having the direct heat to device skin (e.g., the switchable heat path) deactivated, at operation 202. At operation 204, it can be determined if skin of the user is in contact with the device, such as by analyzing, by one or more of the components 104A-D, data from the sensor 107. If the skin of the user is in contact with the device (e.g., the device skin 102), the direct heat path to the device skin can be deactivated (if the switchable heat path is currently activated (in the on state)) or can remain deactivated (if the switchable heat path is currently deactivated (in the off state)). If the skin of the user is not in contact with the device it can be determined whether efficient external cooling is to be used, at operation 206. If efficient external cooling is to be used, the direct heat path to the device skin can be activated, at operation 208. If efficient external cooling is not to be used, then operation 202 can be performed as previously discussed.

The operation 204 can performed, such as by processing circuitry (e.g., one or more of the components 104A-D), by determining that data from the sensor 107 indicates that the user's skin is in contact with the device 101. The operation 206 can be performed, such as by the processing circuitry, by determining whether data from a sensor (e.g., a component 104A-D or the sensor 107) indicates that a temperature of the device skin 102 is sufficiently low (e.g., below a specified threshold). If the temperature is sufficiently low, then efficient external cooling can be used. If the temperature is not sufficiently low, then the direct heat path to the device skin can be deactivated (if the switchable heat path is currently on) or remain deactivated (if the switchable heat path is currently off).

FIG. 3 illustrates, by way of example, an exploded-view diagram of an embodiment of a system 300 for dissipating heat from a device in the region corresponding to the dashed box labelled "3, 4A, 5, 6, 7, 8" in FIG. 1. The system 300 as illustrated includes the TIM 108, can 118, a first thermally conductive material 302, a sliding thermally conductive material 304, and the device skin 102. The first thermally conductive material 302 can be in thermal contact with the can 118. Thermal contact means that the material is sufficiently close to an item, so as to conduct heat from the item, such as to transfer heat from the item to the material. In one or more embodiments, the first thermally conductive material 302 can include a thermally conductive metal, grease, adhesive, ceramic, dielectric, other thermally conductive material, or a combination thereof. The first thermally conductive material 302 conducts heat from the can 118. The first thermally conductive material 302 is in thermal contact with the second thermally conductive material 304. The second thermally conductive material 304 can be on a side 303 of the first thermally conductive material 302 that is opposite a side 305 of the first thermally conductive material 302 on which the can 118 resides.

The second thermally conductive material 304 can include a same or different material as the first thermally conductive material 302. The second thermally conductive material 304 can slide (as indicated by arrow 306). In one or more embodiments, sliding of the second thermally conductive material 304 can be accomplished electromechanically using a motor, such as to slide the second thermally conductive material 304 within a footprint of one or more of the components 104A-D (footprint indicated by the dashed box 307). In one or more embodiments, the second thermally conductive material 304 can be switched between the on and off states manually, such as by a user pushing a slider connected to the second thermally conductive material 304 to place the switchable heat path 112 into the off or on state. The switchable heat path 112 can include the first and second thermally conductive materials 302 and 304. In one or more embodiments, the motor or other component(s) to move the position of the second thermally conductive material 304 can be part of the components 104A-D. When the first thermally conductive material 302 is in the position shown in FIG. 3, the switchable heat path 112 is in the off state. When the first thermally conductive material 302 is at least partially within the footprint of one or more of the components 104A-D, the switchable heat path 112 can be considered in the on state. When in the on state, the second thermally conductive material 304 can (more efficiently as compared to the off state) transfer heat from the components 104A-D to the device skin 102.

FIG. 4A illustrates, by way of example, an exploded-view diagram of another embodiment of a system 400A for dissipating heat from a device in the region corresponding to the dashed box labelled "3, 4A, 5, 6, 7, 8" in FIG. 1, FIG. 4B illustrates, by way of example, an exploded-view diagram of an embodiment of a region 40013 of the system 400A of FIG. 4A corresponding to the dashed box labelled "4B". The system 400A as illustrated includes a switchable heat path that includes thermally conductive posts 404 on the first thermally conductive material 302 and thermally conductive clamps 406 on the device skin 102. The clamps 406 and the posts 404 can be made of a same or different material, such as a same or different material as the first thermally conductive material 302. When the switchable heat path 112 is in the off state, there can be a gap between the posts 404 and the clamps 406. When the switchable heat path 112 is in the on state, the clamps 406 can be in contact with respective posts 404. The position of the clamps 406 can be changed using a motor, actuator, and/or one or more cams coupled to a cam shaft, such as can be a part of the components 104A-D. In one or more embodiments, the clamps 406 can be attached to the first thermally conductive material 302 and the posts 404 can be attached to the device skin 102. In one or more embodiments, some of the clamps 406 and some of the posts 404 can be attached to the first thermally conductive material 302 and some of the clamps 406 and some of the posts 404 can be attached to the device skin 102. FIG. 4A illustrates an embodiment in which the switchable heat path 112 is in the off state. FIG. 4B illustrates an embodiment in which the switchable heat path 112 is in the on state.

In one or more embodiments, moving the clamps 406 can be accomplished electromechanically using a motor, such as to move the clamps 406 into thermal contact with the posts 404. In one or more embodiments, the position of the clamps 406 can be moved between the on and off states manually, such as by a user pushing a slider connected to the clamps 406, such as to place the switchable heat path 112 into the off or on state.

FIG. 5 illustrates, by way of example, an exploded-view diagram of yet another embodiment of a system 500 for dissipating heat from a device in the region corresponding to the dashed box labelled "3, 4A, 5, 6, 7, 8" in FIG. 1. The system 500 as illustrated includes a switchable heat path 112 that includes a thermally conductive cord 503 and the first thermally conductive material 302. The cord 502 can include a material that is the same or different as the first thermally conductive material 302. The cord 502 can be situated between the first thermally conductive material 302 and the device skin 102, such as to be in thermal contact with both of the first thermally conductive material 302 and the device skin 102. The switchable heat path 112 of the system 500 is in an on state when the cord 502 is in thermal contact with both the first thermally conductive material 302 and the device skin 102. In one or more embodiments, the cord 502 can be elastic and an uncompressed diameter of the cord 502 can be larger than the opening 504, such that when the cord 502 is inserted into the opening 504 the cord 502 contacts the device skin 102 and the first thermally conductive material 302. The switchable heat path 112 of the system 500 is in an off state when the cord 502 is not in thermal contact with either the first thermally conductive material 302 and/or the device skin 102. The cord 502 can be situated in an opening 504. The opening 504 can extend through the device skin 102, such as to allow the cord 502 to be removed from the system 500 and/or to be external to the device skin 102 (e.g., not housed, at least partially, by the device skin 102). The cord 502, in one or more embodiments, can be manually situated between the first thermally conductive material 302 and the device skin 102, such as by a user pushing the cord 502 into the opening 504. In one or more embodiments, the cord 502 can be automatically situated in thermal contact with both the first thermally conductive material 302 and the device skin 102, such as by using a spring, motor, or the like. In such embodiments, the cord 502 can be retracted, such as to not be in thermal contact with the thermally conductive material 302 and/or the device skin 102, such as by retracting the spring, actuating the motor to wind the cord around a spindle, or the like.

FIG. 6 illustrates, by way of example, an exploded-view diagram of yet another embodiment of a system 600 for dissipating heat from a device in the region corresponding to the dashed box labelled "3, 4A, 5, 6, 7, 8" in FIG. 1. The system 600 as illustrated includes a plurality of posts 606 that can penetrate respective holes 602 in the device skin 102. The posts 606 can be attached to a third thermally conductive material 604. The third thermally conductive material 604 and/or the posts 606 can be of a same or different material as the first thermally conductive material 604. The third thermally conductive material 604 and the posts 606 can include a same or different material. In one or more embodiments, the third thermally conductive material 604 and the posts 606 can be a part of the device holder 114. The switchable heat path 112 of the system 600 includes the first thermally conductive material, the third thermally conductive material 604, and the posts 606. The switchable heat path 112 is in the on state when the posts are in thermal contact with the first thermally conductive material 302. The switchable heat path 112 is in an off state when the posts 606 are not in thermal contact with the first thermally conductive material 302. A user can place the switchable heat path 112 of the system 600 in an on state by situating the device that includes the device skin 102 on the posts 606 (or equivalently situating the posts 606 through the holes 602).

FIG. 7 illustrates, by way of example, an exploded-view diagram of yet another embodiment of a system 700 for dissipating heat from a device in the region corresponding to the dashed box labelled "3, 4A, 5, 6, 7, 8" in FIG. 1. The system 700 as illustrated includes a phase change material 702 situated between the first thermally conductive material 302 and the device skin 102. The switchable heat path 112 of the system 700 includes the first thermally conductive material 302 and the phase change material 702. The phase change material 702 can be any suitable material that changes from a first phase (e.g., a solid, liquid, or gas) to a second phase (e.g., a solid, liquid, or gas). In the first phase, the phase change material 702 can be more thermally conductive than in the second phase. The switchable heat path 112 can be in an on state when the phase change material 702 is in the first phase. The switchable heat path 112 can be in an off state when the phase change material 702 is in the second phase. In one or more embodiments, the phase change material 702 can be chosen or designed to change phase from the first phase to the second phase at or near an ergo threshold, such as to turn the switchable heat path 112 to an off state if the temperature of the phase change material 702 gets too high or to turn the switchable heat path 112 to an on state if the temperature of the phase change material is below the phase change temperature. Such a configuration can help ensure that the temperature of the device skin 102 stays within the ergo limit(s). In one or more embodiments, the components 104A-D can include a fan, motor, pump, thermal wave guide, or other component that can be activated to transfer heat to or away from the phase change material 702, such as to induce the phase change material 702 to change phase from the first phase to the second phase or vice versa.

FIG. 8 illustrates, by way of example, an exploded-view diagram of yet another embodiment of a system 800 for dissipating heat from a device in the region corresponding to the dashed box labelled "3, 4A, 5, 6, 7, 8" in FIG. 1. The system as illustrated includes a first fluid reservoir 802 and a second fluid reservoir 804 situated between the first thermally conductive material 302 and the device skin 102. The switchable heat path 112 of the system 800 can include the first thermally conductive material 302, the first fluid reservoir 802, and the second fluid reservoir 804. The switchable heat path 112 can be in an on state when fluid in the first reservoir is in thermal contact with both the first thermally conductive material 302 and the device skin 102. The switchable heat path 112 is in an off state when no fluid in the first reservoir 802 is in fluid contact with both of the device skin 102 and the first thermally conductive material 302. The components 104A-D can include a pump that transfers fluid from the first reservoir 802 to the second reservoir 804, such as to turn the switchable heat path 112 to an off state, and/or from the second reservoir 804 to the first reservoir 802, such as to turn the switchable heat path 112 to an on state. Note that while the fluid reservoir 802 is illustrated as being between thermally conductive material 302 and the device skin 102, the reservoir 802 can be in, or part of, the can 118, such as to be in thermal contact with the components 104A-D and the device skin 102 when sufficient fluid is in the reservoir 802.

The discussion above generally considers turning the switchable heat path 112 between on and off states based on an ergo limit, such as to help ensure that the device skin 102 does not harm a user. Other alternative, or additional, considerations for determining whether to switch the switchable heat path 112 on or off can include a battery temperature and/or a temperature of a display (e.g., on the side 103). The battery 110 might benefit from additional heating/cooling depending on the operating temperature of the battery. The switchable heat path 112 may be switched on if it is determined, such as by one or more of the components 104A-D, that the temperature of the battery 110 is too high. The switchable heat path 112 may be switched off if it is determined, such as by one or more of the components 104A-D, that the temperature of the battery 110 is too low.

A display, such as a glass surface of the display, can serve as a good heat spreader. However, local hot spots can negatively impact the quality of the displayed content. The switchable heat path 112 can be switched on or off depending on the temperature of the display. In such embodiments, the switchable heat path 112 can be caused to be in thermal contact with the opposite side of the device skin 102 than that shown in the FIGS. (the side 103). Note that many other applications and determinations as to whether or not to turn the switchable heat path 112 on or off can be realized with the teaching of this disclosure.

Figure 9:
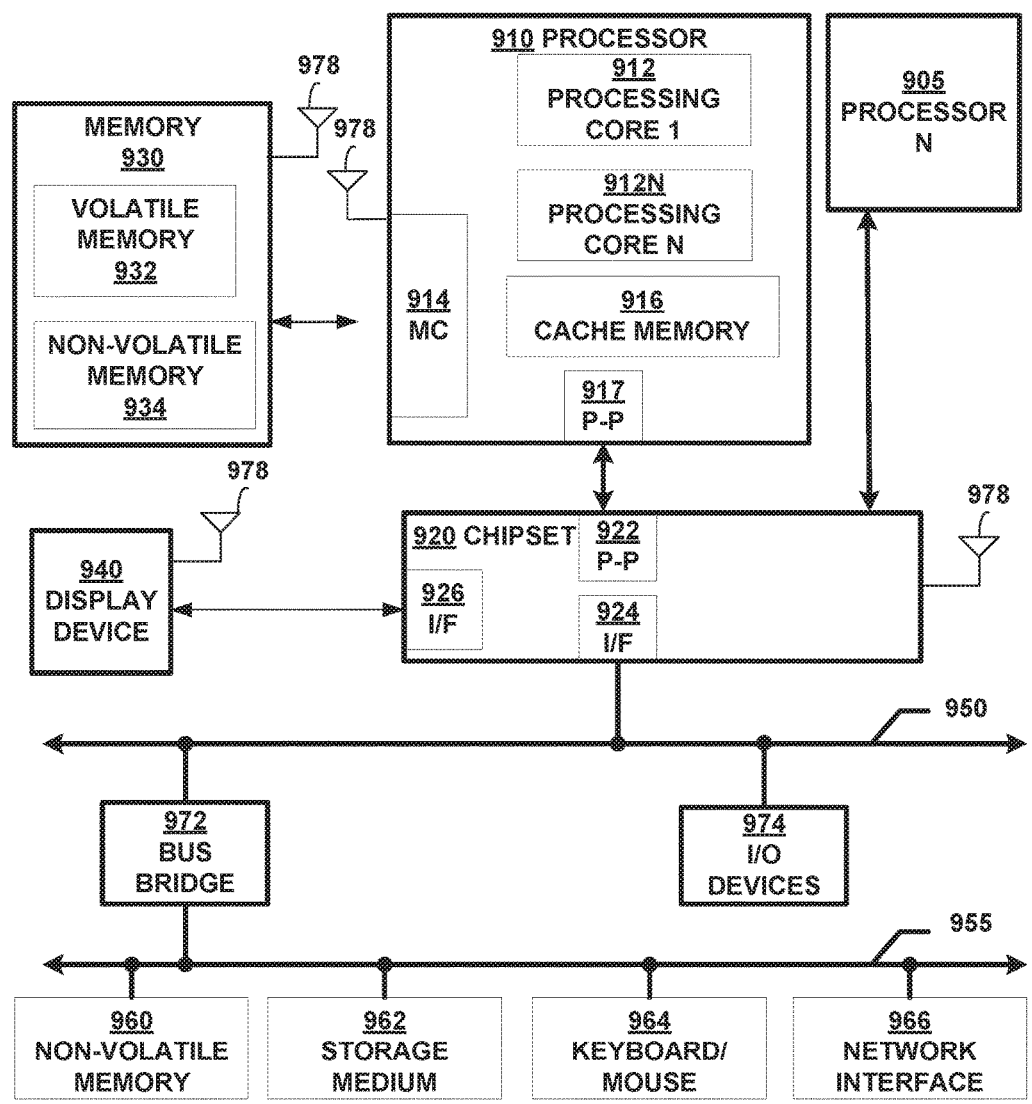
FIG. 9 illustrates, by way of example, a block diagram of an embodiment of an electronic device that includes components that can be included in or connected to a device discussed herein.

FIG. 9 illustrates, by way of example, a block diagram of an embodiment of a system 900 that includes components that can be included in or connected to a device or system discussed herein. An example of a system 900 that can include one or more switchable heat paths 112 is included to show an example of a device application for the present disclosure. The system 900 is merely one example of a device in which embodiments of the present disclosure can be used. Examples of systems 900 include, but are not limited to; personal computers, tablet computers, supercomputers, servers, telecommunications switches, routers, mobile telephones, personal data assistants, MP3 or other digital music players, radios, etc.

In one embodiment, processor 910 has one or more processing cores 912 and 912N, where 912N represents the Nth processing core inside processor 910 where N is a positive integer. In one embodiment, system 900 includes multiple processors including 910 and 905, where processor 905 has logic similar or identical to the logic of processor 910. In some embodiments; processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. The memory 930 is an example of a machine-readable medium. While a machine-readable medium may include a single medium, the term "machine-readable medium" may include a single medium or multiple media (e.g., a centralized or distributed database, and/or associated caches and servers).

The term "machine-readable medium" may include any medium that is capable of storing, encoding, or carrying instructions for execution by a machine (e.g., the device 101) and that cause the machine to perform any one or more of the techniques of the present disclosure, or that is capable of storing, encoding or carrying data structures used by or associated with such instructions. In other words, the various circuitry discussed herein can include instructions and can therefore be termed a machine-readable medium in the context of various embodiments. Other non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In the illustrated embodiment, chipset 920 connects with processor 910 via Point-to-Point (PtP or P-P) interfaces 917 and 922. Chipset 920 enables processor 910 to connect to other elements in system 900. In some embodiments of the invention, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices. Chipset 920 may also be coupled to a wireless antenna 978 to communicate with any device configured to transmit and/or receive wireless signals.

Chipset 920 connects to display device 940 via interface 926. Display device 940 may be, for example, a liquid crystal display (LCD), a plasma display, cathode ray tube (CRT) display, or any other form of visual display device. In some embodiments of the invention, processor 910 and chipset 920 are merged into a single SOC. In addition, chipset 920 connects to one or more buses 950 and 955 that interconnect various elements 974, 960, 962, 964, and 966. Buses 950 and 955 may be interconnected together via a bus bridge 972. In one embodiment, chipset 920 couples with a non-volatile memory 960, a mass storage devices) 962, a keyboard/mouse 964, and a network interface 966 via interface 924 and/or 904, etc.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the components shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into processor core 912.

ADDITIONAL NOTES AND EXAMPLES

In Example 1 a device includes a device skin, a circuit board, a plurality of components on the circuit board, and a switchable heat path situated between the components and the device skin, the switchable heat path configured to be switched between an on state and an off state, the switchable heat path configured to conduct a first amount of heat from the components to the device skin when in the on state and configured to conduct a second, lesser amount of heat from the components to the device skin when in an off state.

In Example 2, the device of Example 1 includes a shield can around one or more components of the plurality of components, and a thermal interface material situated in thermal contact with the one or more components and the shield can.

In Example 3, the device of Example 2 includes, wherein the switchable heat path is situated between the shield can and the device skin.

In Example 4, the device of at least one of Examples 1-3 includes a temperature sensor configured to sense a temperature of the device skin and provide data indicative of the temperature to one or more components of the plurality of components.

In Example 5, the device of Example 4 includes, wherein one or more of the plurality of components is configured as processing circuitry configured to receive the data indicative of the temperature and to switch the switchable heat path between the off state and the on state based on the received data.

In Example 6, the device of at least one of Examples 2-5 includes, wherein the switchable heat path includes a first thermally conductive material in thermal contact with the shield can and a second, slideable thermally conductive material in thermal contact with the first thermally conductive material and the device skin.

In Example 7, the device of at least one of Examples 2-6 includes, wherein the switchable heat path includes a first thermally conductive material in thermal contact with the shield can, a plurality of thermally conductive posts, and a plurality of thermally conductive clamps configured to be in thermal contact with the first thermally conductive material and the device skin when the clamps are in contact with the posts.

In Example 8, the device of at least one of Examples 2-7 includes, wherein the switchable heat path includes a first thermally conductive material in thermal contact with the shield can and a thermally conductive cord, the cord configured to be inserted into the device through a hole in the device skin between the first thermally conductive material and the device skin.

In Example 9, the device of at least one of Examples 2-8 includes, wherein the switchable heat path includes a phase change material configured to change from a first phase to a second phase at a threshold temperature, the phase change material configured to conduct less heat in the second phase than in the first phase.

In Example 10, the device of at least one of Examples 2-9 includes, wherein the switchable heat path includes a first fluid reservoir within a footprint of one or more of the plurality of components and a second fluid reservoir outside of the footprint, and wherein the device includes a pump configured to pump the fluid between the first and second fluid reservoirs.

In Example 11 a system includes a device skin, a circuit board, a plurality of components electrically coupled to the circuit board, the plurality of components including processing circuitry and one or more sensors, and a switchable heat path situated between the components and the device skin, the switchable heat path configured to be switched between an on state and an off state, the switchable heat path configured to conduct a first amount of heat from the components to the device skin when in the on state and configured to conduct a second, lesser amount of heat from the components to the device skin when in an off state, and wherein the processing circuitry is configured to switch the switchable heat path from the on state to the off state in response to the data indicating that a user is in contact with the device skin.

In Example 12, the system of Example 11 includes, wherein the one or more sensors includes the temperature sensor and the data indicates a temperature of the device skin, and wherein the processing circuitry is configured to switch the switchable heat path from the on state to the off state in response to determining the data indicates the temperature is greater than a specified threshold.

In Example 13, the system of Example 12 includes a shield can around one or more components of the plurality of components, and a thermal interface material situated in thermal contact with the one or more components and the shield can.

In Example 14, the system of Example 13 includes, wherein the switchable heat path is situated between the shield can and the device skin.

In Example 15, the system of Example 14 includes, wherein the switchable heat path includes a first thermally conductive material in thermal contact with the shield can and a second, slideable thermally conductive material in thermal contact with the first thermally conductive material and the device skin.

In Example 16, the system of Example 14 includes, wherein the switchable heat path includes a first thermally conductive material in thermal contact with the shield can, a plurality of thermally conductive posts, and a plurality of thermally conductive clamps configured to be in thermal contact with the first thermally conductive material and the device skin when the clamps are in contact with the posts.

In Example 17, the system of Example 14 includes, wherein the switchable heat path includes a first thermally conductive material in thermal contact with the shield can and a thermally conductive cord, the cord configured to be inserted into the device through a hole in the device skin between the first thermally conductive material and the device skin.

In Example 18, the system of Example 14 includes, wherein the switchable heat path includes a phase change material configured to change from a first phase to a second phase at a threshold temperature, the phase change material configured to conduct less heat in the second phase than in the first phase.

In Example 19, the system of Example 14 includes, wherein the switchable heat path includes a first fluid reservoir within a footprint of one or more of the plurality of components and a second fluid reservoir outside of the footprint, and wherein the device includes a pump configured to pump the fluid between the first and second fluid reservoirs.

In Example 20, a method includes receiving, at processing circuitry of a mobile device and from a first temperature sensor of the mobile device, first data indicative of a temperature of at least one of a battery, a display screen of the mobile device, and a device skin of the mobile device, receiving, at the processing circuitry and from at least one sensor including at least one of a heartbeat sensor, a second temperature sensor, a moisture sensor, a conductivity sensor, and a motion sensor second data indicative of whether a user is in physical contact with the mobile device, and in response to determining that the first data indicates that the temperature is less than a specified threshold and the second data indicates that the user is not in physical contact with the mobile device, switching, by the processing circuitry, a switchable heat path of the mobile device from an off state to an on state to increase cooling of at least one of the battery, the display screen, and the processing circuitry by guiding heat to the device skin through the switchable heat path.

In Example 21, the method of Example 20 includes, in response to determining that at least one of (1) the first data indicates that the temperature is greater than the specified threshold and (2) the second data indicates that the user is in physical contact with the mobile device, switching, by the processing circuitry, the switchable heat path from the on state to the off state to reduce cooling of the at least one of the battery, the display screen, and the processing circuitry.

In Example 22, the method of Example 21 includes, wherein the mobile device further includes a shield can around the processing circuitry and a thermal interface material situated in thermal contact with the processing circuitry and the shield can.

In Example 23, the method of Example 22 includes, wherein the switchable heat path is situated between the shield can and the device skin.

In Example 24, the method of Example 23 includes, wherein the switchable heat path includes a first thermally conductive material in thermal contact with the shield can and a second, slideable thermally conductive material in thermal contact with the first thermally conductive material and the device skin.

In Example 25, the method of Example 23 includes, wherein the switchable heat path includes a first thermally conductive material in thermal contact with the shield can, a plurality of thermally conductive posts, and a plurality of thermally conductive clamps configured to be in thermal contact with the first thermally conductive material and the device skin when the clamps are in contact with the posts.

In Example 26, the method of Example 23 includes, wherein the switchable heat path includes a first thermally conductive material in thermal contact with the shield can and a thermally conductive cord, the cord configured to be inserted into the device through a hole in the device skin between the first thermally conductive material and the device skin.

In Example 27, the method of Example 23 includes, wherein the switchable heat path includes a phase change material configured to change from a first phase to a second phase at a threshold temperature, the phase change material configured to conduct less heat in the second phase than in the first phase.

In Example 28, the method of Example 23 includes, wherein the switchable heat path includes a first fluid reservoir within a footprint of the processing circuitry and a second fluid reservoir outside of the footprint, and wherein the device includes a pump configured to pump the fluid between the first and second fluid reservoirs.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device comprising:
   a device skin;
   a circuit board;
   a plurality of components on the circuit board;
   a switchable heat path situated between the components and the device skin, the switchable heat path configured to be switched between an on state and an off state, the switchable heat path configured to conduct a first amount of heat from the components to the device skin when in the on state and configured to conduct a second, lesser amount of heat from the components to the device skin when in an off state; and
   a cord coupled to the switchable heat path, the cord operable to change a position of the switchable heat path between a first position corresponding to the on state and a second position corresponding to the off state.

2. The device of claim 1, further comprising:
   a shield can around one or more components of the plurality of components; and
   a thermal interface material situated in thermal contact with the one or more components and the shield can.

3. The device of claim 2, wherein the switchable heat path is situated between the shield can and the device skin.

4. The device of claim 1, further comprising a temperature sensor configured to sense a temperature of the device skin and provide data indicative of the temperature to one or more components of the plurality of components.

5. The device of claim 4, wherein one or more of the plurality of components is configured as processing circuitry configured to receive the data indicative of the temperature and to switch the switchable heat path between the off state and the on state based on the received data.

6. The device of claim 2, wherein the switchable heat path includes a first thermally conductive material in thermal contact with the shield can and a second, slideable thermally conductive material in thermal contact with the first thermally conductive material and the device skin.

7. The device of claim 2, wherein the switchable heat path includes a first thermally conductive material in thermal contact with the shield can, a plurality of thermally conductive posts, and a plurality of thermally conductive clamps configured to be in thermal contact with the first thermally conductive material and the device skin when the clamps are in contact with the posts.

8. The device of claim 2, wherein the switchable heat path includes a first thermally conductive material in thermal contact with the shield can and the cord, the cord configured to be inserted into the device through a hole in the device skin between the first thermally conductive material and the device skin.

9. The device of claim 2, wherein the switchable heat path includes a phase change material configured to change from a first phase to a second phase at a threshold temperature, the phase change material configured to conduct less heat in the second phase than in the first phase.

10. The device of claim 2, wherein the switchable heat path includes a first fluid reservoir within a footprint of one or more of the plurality of components and a second fluid reservoir outside of the footprint, and wherein the device includes a pump configured to pump the fluid between the first and second fluid reservoirs.

11. A device comprising:
    a device skin;
    a circuit board;
    a plurality of components electrically coupled to the circuit board, the plurality of components including processing circuitry and one or more sensors; and
    a switchable heat path situated between the components and the device skin, the switchable heat path configured to be switched between an on state and an off state, the switchable heat path configured to conduct a first amount of heat from the components to the device skin when in the on state and configured to conduct a second, lesser amount of heat from the components to the device skin when in an off state;

a cord coupled to the switchable heat path, the cord operable to change a position of the switchable heat path between a first position corresponding to the on state and a second position corresponding to the off state; and wherein the processing circuitry is configured to switch, by the cord, the switchable heat path from the on state to the off state in response to the data indicating that a user is in contact with the device skin.

12. The device of claim 11, wherein the one or more sensors includes the temperature sensor and the data indicates a temperature of the device skin, and wherein the processing circuitry is configured to switch the switchable heat path from the on state to the off state in response to determining the data indicates the temperature is greater than a specified threshold.

13. The device of claim 12, further comprising:
a shield can around one or more components of the plurality of components; and
a thermal interface material situated in thermal contact with the one or more components and the shield can.

14. The device of claim 13, wherein the switchable heat path is situated between the shield can and the device skin.

15. The device of claim 14, wherein the switchable heat path includes a first thermally conductive material in thermal contact with the shield can and a second, slideable thermally conductive material in thermal contact with the first thermally conductive material and the device skin.

16. The device of claim 14, wherein the switchable heat path includes a first thermally conductive material in thermal contact with the shield can, a plurality of thermally conductive posts, and a plurality of thermally conductive clamps configured to be in thermal contact with the first thermally conductive material and the device skin when the clamps are in contact with the posts.

17. A method comprising:
receiving, at processing circuitry of a mobile device and from a first temperature sensor of the mobile device, first data indicative of a temperature of at least one of a battery, a display screen of the mobile device, and a device skin of the mobile device;

receiving, at the processing circuitry and from at least one sensor including at least one of a heartbeat sensor, a second temperature sensor, a moisture sensor, a conductivity sensor, and a motion sensor second data indicative of whether a user is in physical contact with the mobile device; and in response to determining that the first data indicates that the temperature is less than a specified threshold and the second data indicates that the user is not in physical contact with the mobile device, switching, by the processing circuitry and a cord coupled to a switchable heat path of the mobile device, the switchable heat path from an off state to an on state to increase cooling of at least one of the battery, the display screen, and the processing circuitry by guiding heat to the device skin through the switchable heat path, the cord operable to change a position of the switchable heat path between a first position corresponding to the on state and a second position corresponding to the off state.

18. The method of claim 17, further comprising in response to determining that at least one of (1) the first data indicates that the temperature is greater than the specified threshold and (2) the second data indicates that the user is in physical contact with the mobile device, switching, by the processing circuitry, the switchable heat path from the on state to the off state to reduce cooling of the at least one of the battery, the display screen, and the processing circuitry.

19. The method of claim 18, wherein the mobile device further includes a shield can around the processing circuitry and a thermal interface material situated in thermal contact with the processing circuitry and the shield can.

20. The method of claim 19, wherein the switchable heat path is situated between the shield can and the device skin.

* * * * *